United States Patent
Ohata et al.

(10) Patent No.: US 12,262,638 B2
(45) Date of Patent: Mar. 25, 2025

(54) TUBULAR HEAT EXCHANGER WITH THERMOELECTRIC POWER GENERATION FUNCTION

(71) Applicant: E-ThermoGentek Co., Ltd., Kyoto (JP)

(72) Inventors: Keiichi Ohata, Kyoto (JP); Nao Majima, Kyoto (JP); Akihiko Ikemura, Kyoto (JP); Michio Okajima, Kyoto (JP); Shutaro Nambu, Kyoto (JP)

(73) Assignee: E-ThermoGentek Co., Ltd., Kyoto (JP)

( * ) Notice: Subject to any disclaimer, the term of this patent is extended or adjusted under 35 U.S.C. 154(b) by 224 days.

(21) Appl. No.: 17/605,177

(22) PCT Filed: Nov. 5, 2020

(86) PCT No.: PCT/JP2020/041386
§ 371 (c)(1),
(2) Date: Oct. 20, 2021

(87) PCT Pub. No.: WO2021/149326
PCT Pub. Date: Jul. 29, 2021

(65) Prior Publication Data
US 2022/0190227 A1 Jun. 16, 2022

(30) Foreign Application Priority Data
Jan. 23, 2020 (JP) ................. 2020-008937

(51) Int. Cl.
*H10N 10/13* (2023.01)
*F28D 7/16* (2006.01)
*F28F 13/00* (2006.01)

(52) U.S. Cl.
CPC ............... *H10N 10/13* (2023.02); *F28D 7/16* (2013.01); *F28F 13/003* (2013.01); *F28F 2013/006* (2013.01); *F28F 2275/06* (2013.01)

(58) Field of Classification Search
None
See application file for complete search history.

(56) References Cited

U.S. PATENT DOCUMENTS

| | | | | |
|---|---|---|---|---|
| 2011/0099991 A1* | 5/2011 | Stefan | ................... | H10N 10/81 136/201 |
| 2011/0146743 A1* | 6/2011 | Oesterle | ................ | H10N 10/17 136/201 |

(Continued)

FOREIGN PATENT DOCUMENTS

| | | |
|---|---|---|
| JP | 2000-74576 A | 3/2000 |
| JP | 2009-267316 A | 11/2009 |

(Continued)

OTHER PUBLICATIONS

Machine translation of JP2013510417A (Year: 2013).*
International Search Report for corresponding Application No. PCT/JP2020/041386, mailed Dec. 22, 2020.

*Primary Examiner* — Ryan S Cannon
(74) *Attorney, Agent, or Firm* — Renner, Otto, Boisselle & Sklar, LLP

(57) ABSTRACT

A tubular heat exchanger, with a thermoelectric power generation function, includes: a thermoelectric power generation module 2 mounted on an outer circumferential surface of the heat exhaust tube 1; and a cooling pipe 3 mounted on an outer circumferential surface of the thermoelectric power generation module 2. The cooling pipe 3 is for allowing a cooling material to flow therethrough. The thermoelectric power generation module 2 performs thermoelectric power generation by using the outer circumferential surface of the heat exhaust tube 1 as a high-temperature (Continued)

source and using the inner circumferential surface of the cooling pipe 3 as a low-temperature source. The cooling pipe 3 is in tight attachment to the outer circumferential surface of the thermoelectric power generation module 2.

7 Claims, 3 Drawing Sheets

(56) References Cited

U.S. PATENT DOCUMENTS

| | | | |
|---|---|---|---|
| 2013/0000285 A1* | 1/2013 | Prior | H10N 10/13 228/101 |
| 2014/0311543 A1* | 10/2014 | Jinushi | H10N 10/13 136/205 |
| 2018/0130938 A1 | 5/2018 | Kohtani | |
| 2018/0363852 A1 | 12/2018 | Kim | |
| 2020/0141299 A1* | 5/2020 | Kawaguchi | F02G 5/04 |

FOREIGN PATENT DOCUMENTS

| | | |
|---|---|---|
| JP | 2012-80761 A | 4/2012 |
| JP | 2013510417 A * | 3/2013 |
| JP | 2016-207995 A | 12/2016 |
| JP | 2018-535628 A | 11/2018 |
| JP | 2019-47565 A | 3/2019 |
| JP | 2019-161831 A | 9/2019 |
| JP | 2019-198165 A | 11/2019 |
| JP | 2020-10559 A | 1/2020 |

* cited by examiner

TUBULAR HEAT EXCHANGER WITH THERMOELECTRIC POWER GENERATION FUNCTION

TECHNICAL FIELD

The present invention relates to a heat exchanger having a function of performing thermoelectric power generation by using heat of a heat exhaust tube.

BACKGROUND ART

In the present industrial society, an enormous amount of waste heat, which corresponds to 60% or more of the total amount of supplied primary energy, is exhausted to the natural environment mainly from factories, power plants, ironworks, automobiles, buildings, illuminators, ships, and so on. It is estimated that 75% or more of the waste heat is exhausted in the forms of hot water and gas that have a temperature of 250° C. or less.

The waste heat is generally transferred through a heat exhaust tube. A tubular heat exchanger that uses cold water and the like flowing outside the heat exhaust tube to perform heat exchanging with respect to heat of high-temperature gas and the like flowing in the heat exhaust tube is capable of cooling the high-temperature gas; however, reuse of the exchanged heat transferred to the cold water remains difficult, which poses a problem of energy saving.

As illustrated in FIG. 4, Patent Document 1 discloses a tubular heat exchanger with a thermoelectric power generation function. The heat exchanger includes a thermoelectric power generation module 110 having a flexible structure, which is mounted between the outside of a drain pipe 100 through which high-temperature gas 100A or the like flows and a cooling water pipe 120 through which cooling water 120A flows, and generates power by using the temperature differential therebetween.

CITATION LIST

Patent Document

PATENT DOCUMENT 1: Japanese Unexamined Patent Publication No. 2009-267316

SUMMARY OF THE INVENTION

Technical Problem

In the tubular heat exchanger with a thermoelectric power generation function disclosed in Patent Document 1, the thermoelectric power generation module 110 is directly water-cooled. Therefore, it is necessary to provide a waterproof unit such as mounting a waterproof sheet or the like on the outside of the thermoelectric power generation module 110. However, the waterproof unit such as the waterproof sheet, when provided, causes heat loss, leading to a problem that power generation efficiency of the thermoelectric power generation module 110 decreases.

The present invention is made in view of the above-described problem, and it is an object of the present invention to provide a tubular heat exchanger with a thermoelectric power generation function, which has a small heat loss and a high power generating efficiency.

Solution to the Problem

A tubular heat exchanger with a thermoelectric power generation function, of the present invention includes: a thermoelectric power generation module mounted on an outer circumferential surface of the heat exhaust tube; and a cooling pipe mounted on an outer circumferential surface of the thermoelectric power generation module, the cooling pipe being for allowing a cooling material to flow therethrough. The thermoelectric power generation module performs thermoelectric power generation by using the outer circumferential surface of the heat exhaust tube as a high-temperature source and using the inner circumferential surface of the cooling pipe as a low-temperature source. The cooling pipe is in tightly attached to the outer circumferential surface of the thermoelectric power generation module.

Advantages of the Invention

According to the present invention, it is possible to provide a tubular heat exchanger with a thermoelectric power generation function, which has a small heat loss and a high power generating efficiency.

DESCRIPTION OF EMBODIMENT

Embodiment of the present invention will now be described in detail with reference to the drawings. Note that the present invention is not limited to the following embodiment. Further, the present invention may be changed without departing from the scope of effects brought about by the present invention.

Figure 1:
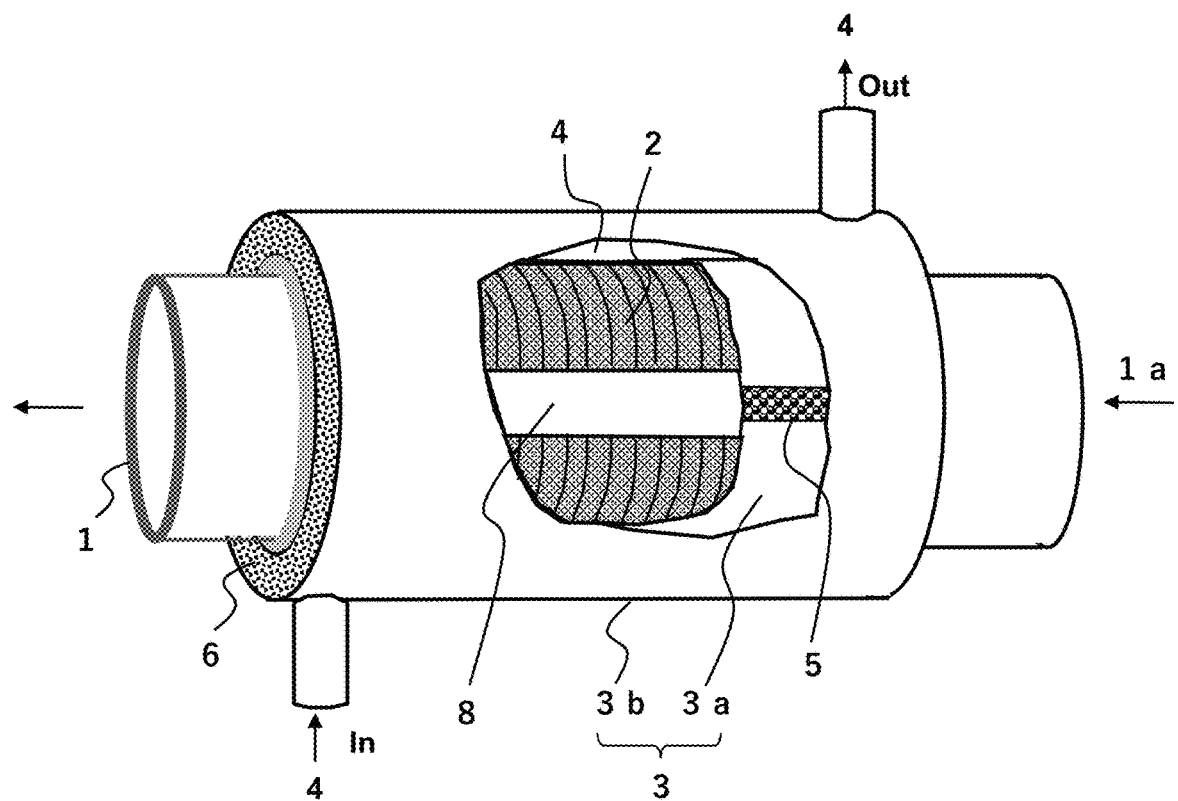
FIG. 1 is an external perspective view illustrating a structure of a tubular heat exchanger with a thermoelectric power generation function, according to an embodiment of the present invention.
Figure 2:
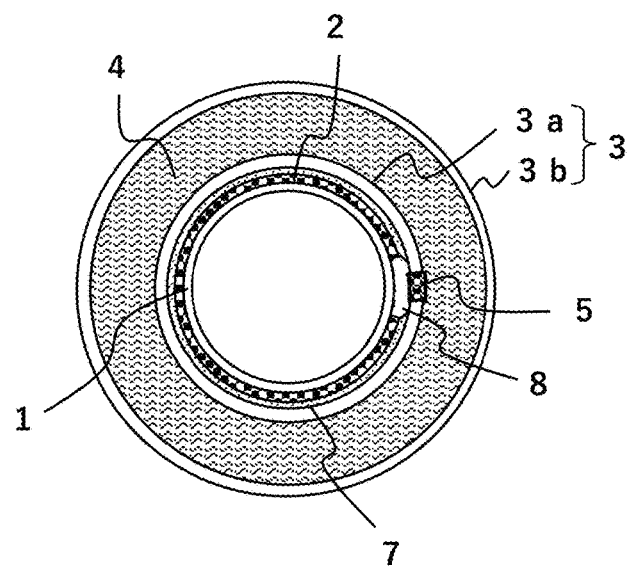
FIG. 2 is a cross-sectional view of the tubular heat exchanger with a thermoelectric power generation function illustrated in FIG. 1.

FIG. 1 and FIG. 2 are diagrams illustrating a structure of a tubular heat exchanger with a thermoelectric power generation function (hereinafter, simply referred to as "heat exchanger"), according to an embodiment of the present invention. FIG. 1 is an external perspective view of the heat exchanger, with a part thereof cut away to show an internal structure of the heat exchanger. FIG. 2 is a cross-sectional view taken perpendicularly to an axial direction of the heat exchanger. The "axial direction" herein refers to a center axis direction of a heat exhaust tube 1.

As illustrated in FIGS. 1 and 2, the tubular heat exchanger according to the present embodiment includes: a thermoelectric power generation module 2 mounted on an outer circumferential surface of the heat exhaust tube 1; and a cooling pipe 3 mounted on an outer circumferential surface of the thermoelectric power generation module 2. The cooling pipe 3 is for allowing a cooling material 4 such as cooling water to flow therethrough. The thermoelectric power generation module 2 performs thermoelectric power generation by using the outer circumferential surface of the heat exhaust tube 1 as a high-temperature source and using the inner circumferential surface of the cooling pipe 3 as a low-temperature source.

In a part of the thermoelectric power generation module 2 relative to the circumferential direction, there is a gap 8 extending along the axial direction. The cooling pipe 3 is a double cooling pipe including an inner pipe 3a and an outer pipe 3b. The inner pipe 3a and the outer pipe 3b are welded at their axial ends. Reference numeral 5 in the drawing denotes a welded portion. Alternatively, the axial ends of the inner pipe 3a and the outer pipe 3b may be sealed with a resin 6.

The inner pipe 3a is tightly wound around the outer circumferential surface of the thermoelectric power generation module 2. This way, the cooling pipe 3 is in tight attachment to the outer circumferential surface of the thermoelectric power generation module 2. As a result, in the thermoelectric power generation module 2, heat loss is reduced and a temperature differential can be increased, which improves power generating efficiency.

Both wound ends of the inner pipe 3a in the circumferential direction are welded along the axial direction at the position of the gap 8. This way, it is possible to avoid an adverse effect on the thermoelectric power generation module 2 due to heat generated when welding the inner pipe 3a.

For example, when three thermoelectric power generation modules 2 of 10 cm square are wound around the heat exhaust tube 1 whose outer circumference is 34 cm, a gap 8 of 3 cm is formed. Around the outer circumferential surface of the thermoelectric power generation module 2, the inner pipe 3a made of a stainless plate of 0.1 mm in thickness is tightly wound, and laser welding is performed above the gap 8. Around the outer circumferential surface of the inner pipe 3a, the outer pipe 3b made of a stainless plate of 0.1 mm in thickness is wound, leaving a space of 2 cm, or an existing pipe is inserted, and ends of the inner pipe 3a and the outer pipe 3b in the axial direction are welded or sealed with resin. This way, the double cooling pipe 3 is formed.

According to the present embodiment, it is possible to achieve a tubular heat exchanger with a thermoelectric power generation function, which has a small heat loss and a high power generating efficiency. Further, in a case where the cooling pipe 3 is structured as a double cooling pipe having the inner pipe 3a and the outer pipe 3b, an adverse effect on the thermoelectric power generation module 2 due to heat generated when welding the inner pipe 3a can be avoided by welding both wound ends of the inner pipe 3a at the position of the gap 8 formed in the thermoelectric power generation module 2.

While the present invention has been described with reference to the preferred embodiment, such description is not intended to limit the present invention, and various changes are possible.

For example, the thermoelectric power generation module 2 may be attached to the outer circumferential surface of the heat exhaust tube 1 with a thermal conductive sheet (not shown) interposed therebetween. Further, as illustrated in FIG. 2, a heat transfer sheet 7 may be provided between the thermoelectric power generation module 2 and the cooling pipe 3. This allows further reduction of the heat loss from the heat exhaust tube 1 to the cooling pipe 3, in relation to the attachment of the thermoelectric power generation module. As a result, a temperature differential in the thermoelectric power generation module 2 can be further increased, and the power generating efficiency can be further improved.

For example, the thermal conductive sheet may a silicone sheet having a heat transfer rate of 10 W/mK and a thickness of 0.1 mm. For example, the heat transfer sheet 7 may be a flexible carbon sheet having a heat transfer rate of 30 W/mK and a thickness of 0.1 mm. Alternatively, the heat transfer sheet 7 may be a flexible porous metal film, a metal-plated fabric, or the like. The thermal conductive sheet and the heat transfer sheet 7 also serve as a cushion for the thermoelectric power generation module 2, at a time of attaching the thermoelectric power generation module 2 and tightly winding the inner pipe 3a.

Figure 3:
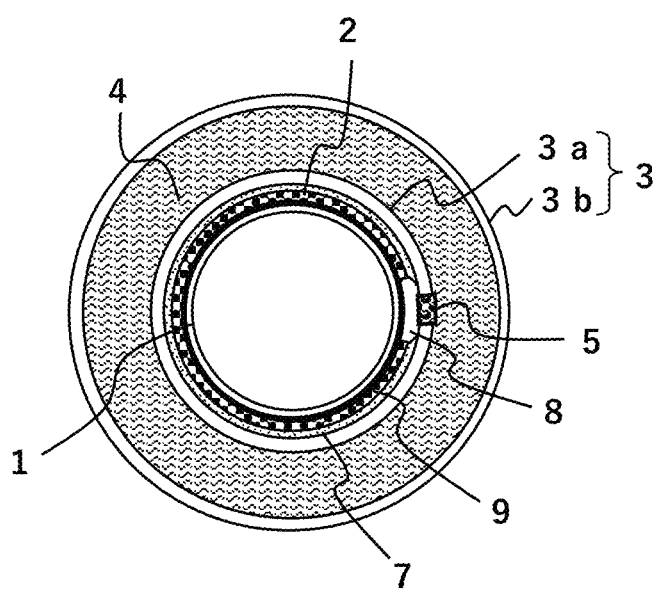
FIG. 3 is a cross-sectional view of a tubular heat exchanger with a thermoelectric power generation function, according to a variation of the present invention.
Figure 4:
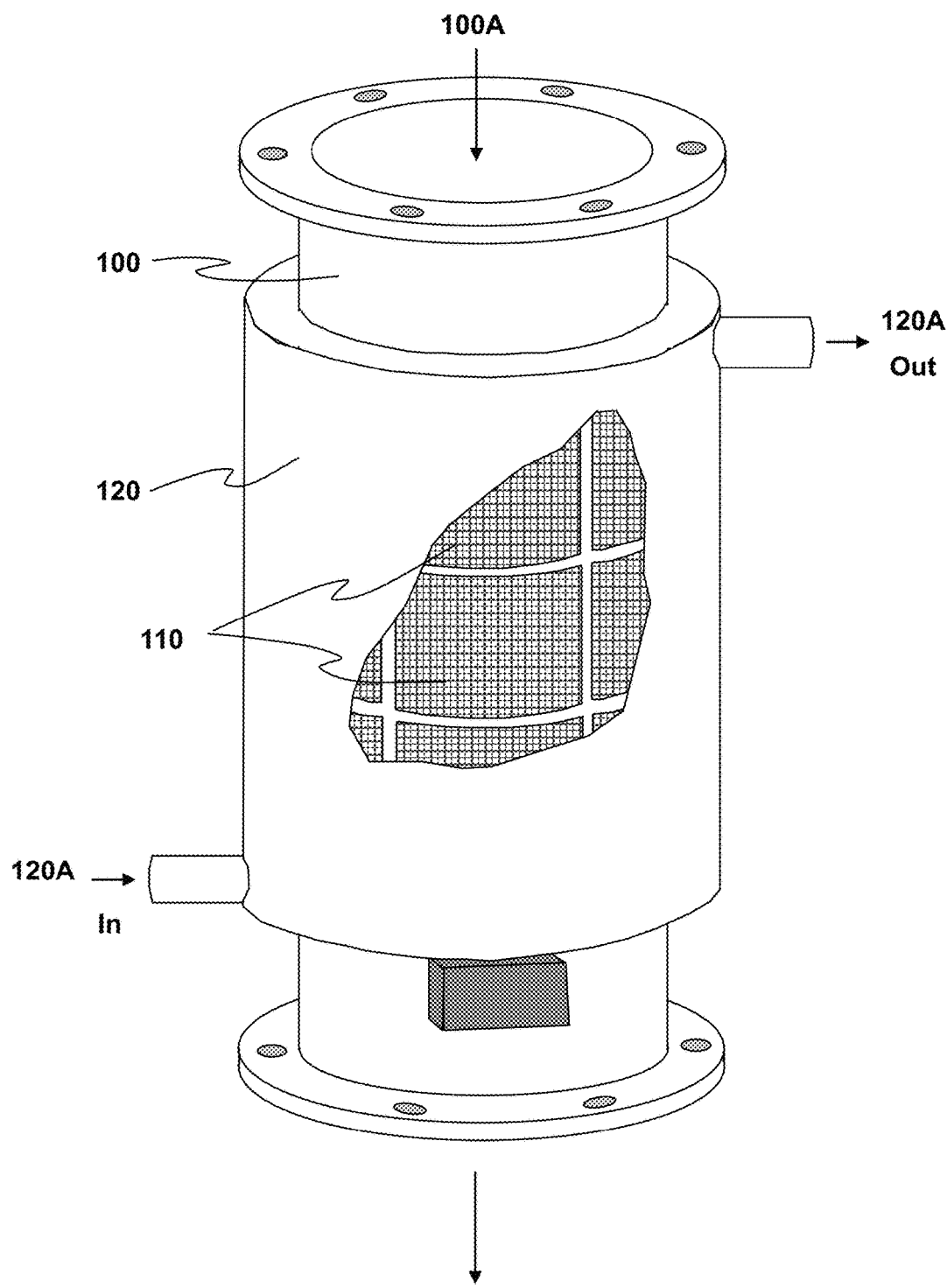
FIG. 4 is an external perspective view of a traditional tubular heat exchanger with a thermoelectric power generation function.

Further, as illustrated in FIG. 3, the thermoelectric power generation module 2 may be attached to the outer circumferential surface of the heat exhaust tube 1 with a heat collector 9 interposed therebetween. This makes heat collection from the heat exhaust tube 1 efficient, and further raises the temperature at the high-temperature source of the thermoelectric power generation module. As a result, a temperature differential in the thermoelectric power generation module 2 can be further increased, and the power generating efficiency can be further improved. For example, the heat collector 9 may be a copper plate of 0.2 mm in thickness.

Further, the thermoelectric power generation module 2 may be attached to the outer circumferential surface of the heat exhaust tube 1 with a heat transfer sheet interposed therebetween. For example, the heat transfer sheet may be a flexible carbon sheet having a heat transfer rate of 30 W/mK and a thickness of 0.1 mm. Note that the heat collector 9 and the heat transfer sheet may be used in combination.

DESCRIPTION OF REFERENCE CHARACTERS

1 Heat Exhaust Tube
2 Thermoelectric Power Generation Module
3 Cooling Pipe
3a Inner Pipe
3b Outer Pipe
5 Welded Portion
4 Cooling Material
6 Resin
7 Heat Transfer Sheet
8 Gap
9 Heat Collector

The invention claimed is:

1. A tubular heat exchanger with a thermoelectric power generation function, comprising:
    a thermoelectric power generation module mounted on a cylindrical outer circumferential surface of a heat exhaust tube; and
    a cooling pipe mounted on an outer circumferential surface of the thermoelectric power generation module, the cooling pipe being for allowing a cooling material to flow therethrough,
    wherein
    the thermoelectric power generation module performs thermoelectric power generation by using the outer circumferential surface of the heat exhaust tube as a high-temperature source and using an inner circumferential surface of the cooling pipe as a low-temperature source,
    the thermoelectric power generation module is a flexible thermoelectric power generation module,
    the cooling pipe is a double cooling pipe including a cylindrical inner pipe and an outer pipe, and the cooling material flows between the inner pipe and the outer pipe,
    the flexible thermoelectric power generation module is configured such that a gap extending along the axial direction is provided in a part of the thermoelectric power generation module relative to the circumferential direction, and both wound ends of the inner pipe in the circumferential direction are welded to each other along the axial direction, and a welded portion of the both wound ends is located inside the gap.

2. The tubular heat exchanger of claim 1, further comprising
a heat transfer sheet arranged between the outer circumferential surface of the thermoelectric power generation module and an inner circumferential surface of the inner pipe.

3. The tubular heat exchanger of claim 2, wherein the heat transfer sheet is made of a flexible porous metal film.

4. The tubular heat exchanger of claim 2, wherein the heat transfer sheet is made of a metal-plated fabric.

5. The tubular heat exchanger of claim 2, wherein the heat transfer sheet is made of a flexible carbon sheet.

6. The tubular heat exchanger of claim 2, further comprising
a heat collector arranged between the outer circumferential surface of the heat exhaust tube and the inner circumferential surface of the thermoelectric power generation module.

7. The tubular heat exchanger of claim 1, further comprising
a heat collector arranged between the outer circumferential surface of the heat exhaust tube and the inner circumferential surface of the thermoelectric power generation module.

* * * * *